United States Patent
Han et al.

(10) Patent No.: US 6,335,297 B1
(45) Date of Patent: Jan. 1, 2002

(54) METHOD FOR FORMING CONDUCTIVE LINE OF SEMICONDUCTOR DEVICE

(75) Inventors: Chang Hee Han; Byung Hak Lee, both of Chungcheongbuk-do (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/592,438

(22) Filed: Jun. 12, 2000

(30) Foreign Application Priority Data

Jun. 16, 1999 (KR) .............................. 99-22579

(51) Int. Cl.[7] .................. H01L 21/31; H01L 21/469
(52) U.S. Cl. .................. 438/785; 438/685; 438/648
(58) Field of Search ................... 438/785, 502, 438/650, 658, 656

(56) References Cited

U.S. PATENT DOCUMENTS 5,132,756 A * 7/1992 Matsuda ................. 357/23.1
5,506,449 A * 4/1996 Nakamo et al. ............ 257/758
5,994,183 A * 11/1999 Huang et al. ............... 438/256
6,162,715 A * 12/2000 Mak et al. .................. 438/592

OTHER PUBLICATIONS

Kaustav Banerjee et al. "Temperature and Current Effects on Small–Geometry–Contact Resistance," 1997 IEEE, pp. 5.5.1–5.5.4.

K.N. Kim et al., "Highly Manufacturable 1Gb SDRAM," 1997 Symposium on VLSI Technology Digest of Technical Papers, pp. 9 and 10.

\* cited by examiner

*Primary Examiner*—Richard Elms
*Assistant Examiner*—Brad Smith
(74) *Attorney, Agent, or Firm*—Fleshner & Kim, LLP

(57) ABSTRACT

Method for forming a conductive line of a semiconductor device which has a high thermal stability and low electrical resistance includes the steps of forming an insulating layer on a semiconductor substrate, sequentially forming a semiconductor layer and a tungsten film on the insulating layer, nitrifying the tungsten film with heat treatment, and selectively etching the tungsten film and the semiconductor layer.

22 Claims, 9 Drawing Sheets first heat treatment in the ambient of NH₃ second heat treatment in the ambient of N₂ or Ar

METHOD FOR FORMING CONDUCTIVE LINE OF SEMICONDUCTOR DEVICE

BACKGROUND OF THE INVENTION

1. Field of the Invention

The present invention relates to a semiconductor devise and, more particularly, to a method for forming a conductive line of a semiconductor device which enhances thermal stability and ensures low electric resistance.

2. Background of the Related Art

In forming a conductive line of tungsten/silicon structure, tungsten and silicon react with each other at a temperature above 600° C. and tend to form tungsten silicide. The tungsten silicide has electric resistance ten times as high as that of tungsten, so that it is difficult to use the tungsten silicide as a material for a conductive line of a semiconductor device. Furthermore, it requires a reaction prevention film between tungsten and silicon because silicon is destructed when the silicide is formed.

A conventional method for forming a conductive line of a semiconductor device will be explained with reference to the attached drawings.

FIGS. 1a to 1d are cross-sectional views showing a conventional method for forming a conductive line formed with tungsten/reaction prevention film/silicon structure, and FIGS. 2a to 2e are cross-sectional views showing another conventional method for forming a conductive line.

Process steps of forming a conductive line of a tungsten/reaction prevention film/silicon structure will be explained with reference to FIGS. 1a to 1d.

Firstly, a gate insulating film 12 is formed on a semiconductor substrate 11, and a semiconductor layer 13 for forming the conductive line is formed thereon, as shown in FIG. 1a. At this time, polysilicon may be used for the semiconductor layer 13. Referring to FIG. 1b, a reaction prevention film 14 and a tungsten film 15 are sequentially formed on the semiconductor layer 13. The reaction prevention film 14 is made of a material which doesn't react with the tungsten film 15 and the semiconductor layer 13, such as nitride of transition metal and refractive metal, or oxide having electric conductivity.

Thereafter, a tungsten film 15, a reaction prevention film 14 and a semiconductor layer 13 are selectively etched by photolithography to form a conductive line 16, as shown in FIG. 1c. Referring to FIG. 1d, impurity ions are implanted on an entire surface of the substrate using the conductive line 16 as a mask, and then the implanted ions are drive-in diffused to form source and drain regions 17 within the surface of the semiconductor substrate 11 on both sides of the conductive line 16. The reaction prevention film 14 in a tungsten layer/reaction prevention film/semiconductor layer structure of the conductive line restrains reaction between the semiconductor layer 13 and the tungsten film 15.

The process of forming the conductive line, as described above, is performed at a low temperature. Thus, thermal stress given to lower layers placed below the conductive line is not so high and impurity distribution in semiconductor substrate 11 is rarely varied.

Process steps of forming a conductive line at a high temperature which is performed in a reversed way of the above steps will be explained.

FIGS. 2a to 2e shows process steps of forming a conductive line of a denudation W/Si structure. First, a gate insulating film 12 is formed on a semiconductor substrate 11, and a semiconductor layer 13 for forming a conductive line is formed thereon, as shown in FIG. 2a. At this time, the semiconductor layer 13 is formed with polysilicon.

Referring to FIG. 2b, a tungsten nitride film 21 is formed on the semiconductor layer 13. Referring to FIG. 2c, the substrate on which the tungsten nitride film 21 is formed is heat-treated at 1000° C. to form a reaction prevention layer (not shown) of silicon nitride between the tungsten nitride film 21 and the semiconductor layer 13. Simultaneously, the tungsten nitride film 21 is changed into a tungsten film 21a.

Then, the tungsten film 21a and the semiconductor layer 13 are selectively etched by photolithography to form a conductive line 22, as shown in FIG. 2d. Referring to FIG. 2e, impurity ions are implanted on an entire surface of the substrate using the conductive line 22 as a mask, and the implanted ions are drive-in diffused to form source and drain regions 17 within the surface of the semiconductor substrate 11 on both sides of the conductive line 22.

In the aforementioned process of forming the conductive line, the tungsten nitride film 21 is deposited and heat-treated on the semiconductor layer 13, and the tungsten nitride film 21 which is unstable at a high temperature is changed into the tungsten film 21a during the heat treatment. Simultaneously, nitrogen contained in the tungsten nitride film 21 and silicon contained in the semiconductor layer 13 are combined, to form silicon nitride at the interface of tungsten layer 21a and the semiconductor layer 13. This silicon nitride restrains reaction of silicon and tungsten even at a high temperature above 1000° C. As described above, though the conductive line of denudation W/Si structure has a high electric resistance in a deposited state, its resistance after a heat treatment at a high temperature executed thereto is similar to that of the conductive line having tungsten/reaction prevention film/silicon structure.

Accordingly, the denudation W/Si structured conductive line restrains reaction of tungsten and silicon, and obtains satisfactory thermal stability without employing deposition of a reaction prevention film.

However, the related art method for forming a conductive line of a semiconductor device has the following problems.

Firstly, in forming a conductive line with a tungsten/reaction prevention film/silicon structure in which a reaction prevention film is formed to restrict reaction of tungsten and silicon, an additional deposition process of the reaction prevention film is required. Furthermore, the resistance of the reaction prevention film is greater than that of tungsten so that the electric resistance of a gate is increased, thereby deteriorating operation characteristics of a device.

Secondly, the formation of the reaction prevention film affects the electric conductivity of the tungsten film formed thereon, so as to worsen electric characteristic of a conductive line.

Thirdly, since the conductive line is formed at a low temperature, thermal stability may not be ensured in the subsequent heat treatment process.

Additionally, in forming a denudation tungsten/silicon structured conductive line in which a tungsten nitride film is formed on silicon, the reaction prevention layer of silicon nitride is formed by a heat treatment at a high temperature. Accordingly, considerable thermal stress is applied to the device.

Furthermore, impurity distribution of the semiconductor substrate is changed during the heat treatment in a high temperature, characteristics of the device is deteriorated.

SUMMARY OF THE INVENTION

Accordingly, the present invention is directed to a method for forming a conductive line of a semiconductor device that substantially obviates one or more of the problems due to limitations and disadvantages of the related art.

An object of the present invention is to provide a method for forming a conductive line of a semiconductor device which has a low electric resistance and high thermal stability.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method for forming a conductive line of a semiconductor device includes the steps of forming an insulating layer on a semiconductor substrate, sequentially forming a semiconductor layer and a tungsten film on the insulating layer, nitrifying the tungsten film with heat treatment, and selectively etching the tungsten film and the semiconductor layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

FIGS. 3a to 3f are cross-sectional views showing process steps of forming a conductive line of a semiconductor device according to the present invention. The method for forming a conductive line of a semiconductor device according to the present invention provides a conductive line having a low resistance characteristic, with simplified processes at lower temperature.

Figure 1A:
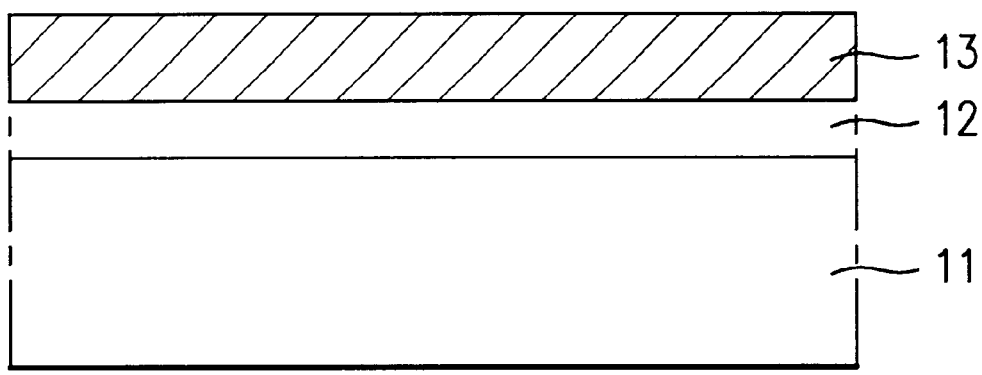
FIGS. 1a to 1d are cross-sectional views showing a conventional process of forming a conductive line of a semiconductor device.
Figure 1B:
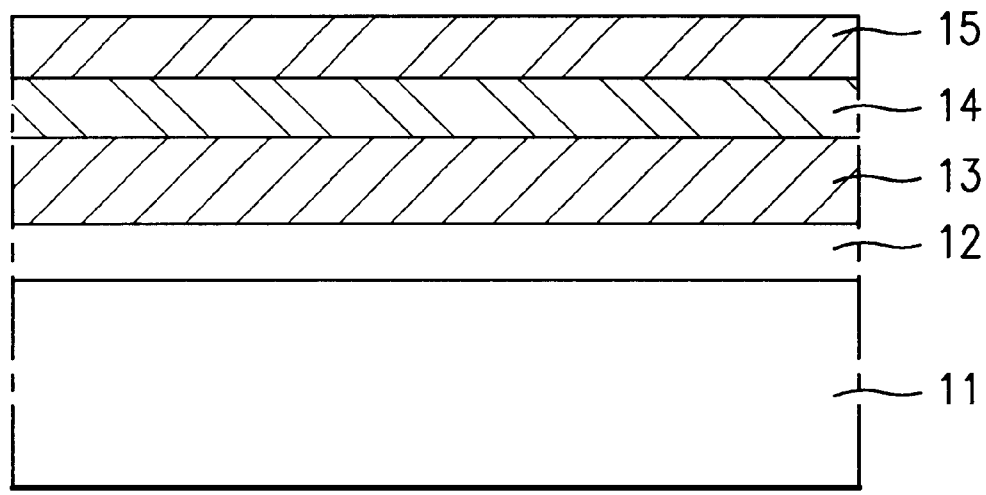
Figure 1C:
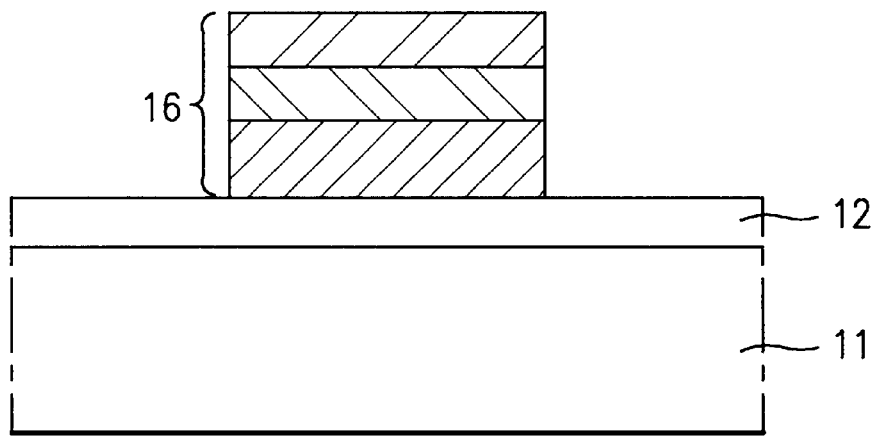
Figure 1D:
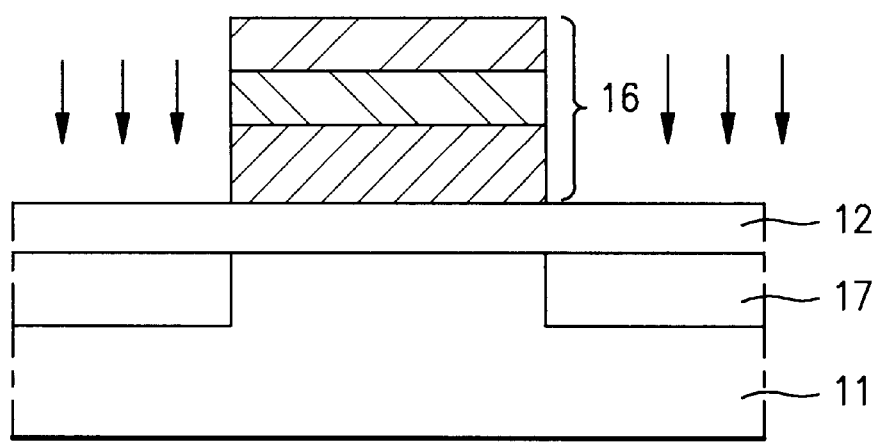
Figure 2A:
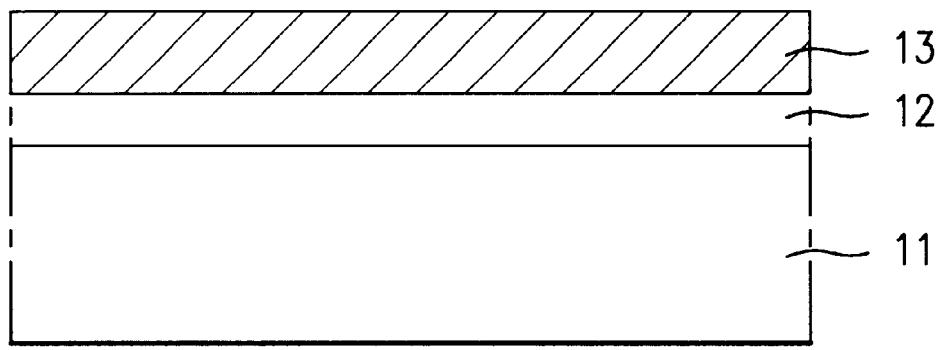
FIGS. 2a to 2e are cross-sectional views showing another conventional process of forming a conductive line of a semiconductor device.
Figure 2B:
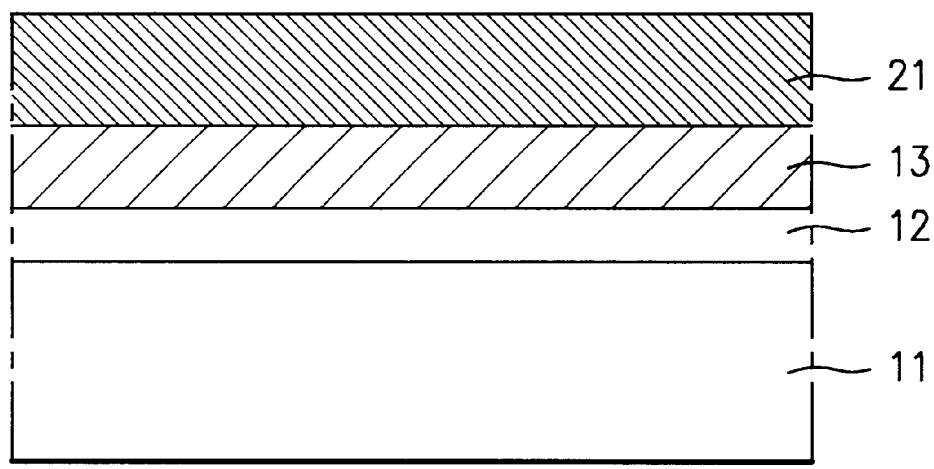
Figure 2C:
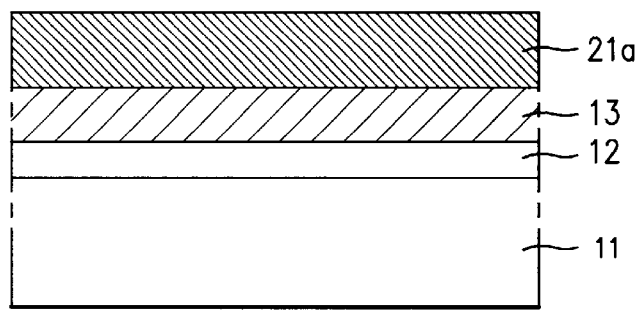
Figure 2D:
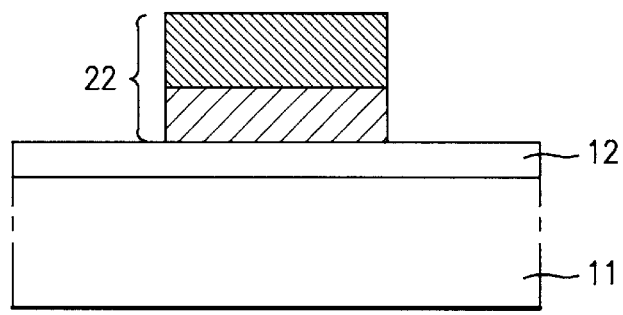
Figure 2E:
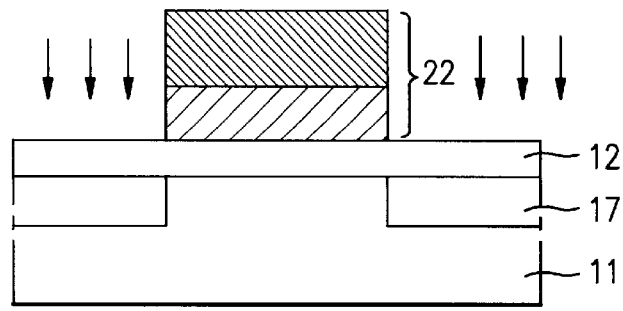
Figure 3A:
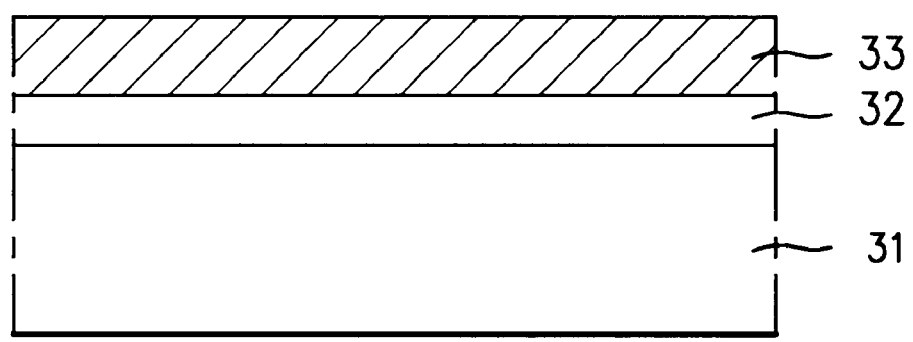
FIGS. 3a to 3f are cross-sectional views showing a process of forming a conductive line of a semiconductor device according to the present invention.

Firstly, a gate insulating film 32 is formed on a semiconductor substrate 31, and a semiconductor layer 33 for forming a conductive line is formed thereon, as shown in FIG. 3a. At this time, the semiconductor layer 33 may be formed with silicon, germanium or compound of silicon and germanium ($si_xGe_{1-x}$) with a thickness of 600–800 Å.

Figure 3B:
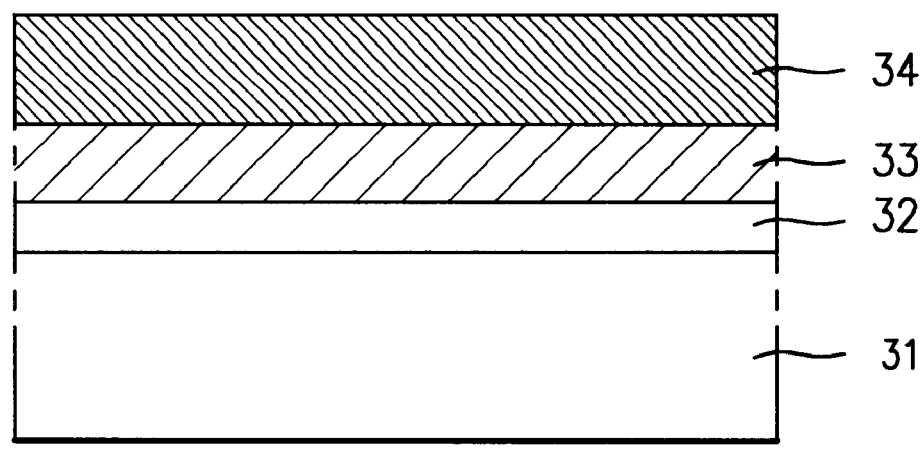

Thereafter, a tungsten film 34 is formed on semiconductor layer 33, as shown in FIG. 3b. Here, a molybdenum (Mo) layer instead of the tungsten film may be formed on the semiconductor layer 33 with a thickness of 600–800 Å.

Figure 3C:
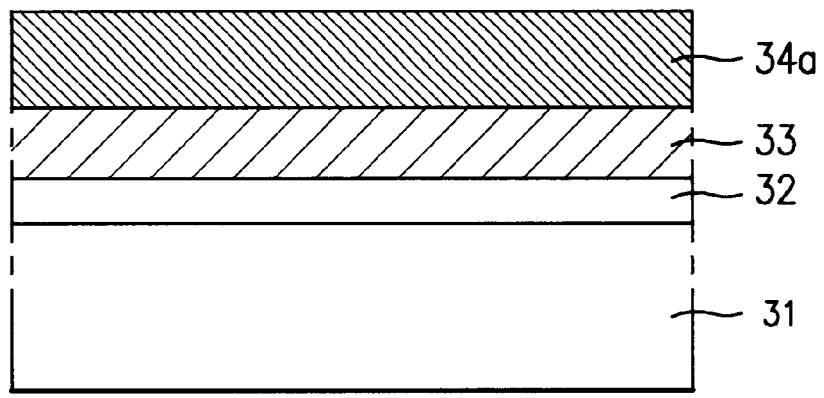

A first heat treatment is then performed, as shown in FIG. 3c, on an entire surface of the substrate, on which the tungsten film 34 is formed, at 500–1000° C. in an ambient of $NH_3$ to nitrify the tungsten film 34, thereby forming a nitrified tungsten film 34a.

Figure 3D:
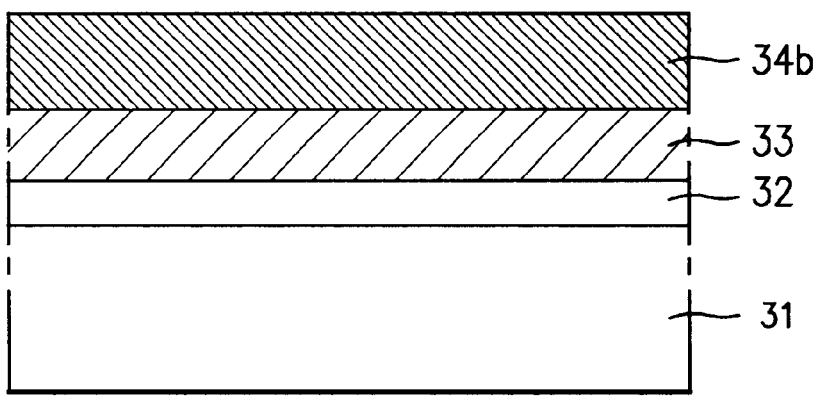

Referring to FIG. 3d, a second heat treatment is performed on an entire surface of the substrate, on which the nitrified tungsten film 34a is formed, at 600–1410° C. in an ambient of $N_2$ or Ar. During the second heat treatment, a nitrogen content of nitrified tungsten film 34a is reduced, and simultaneously, a the tungsten film 34b of a reduced nitrogen content is formed with the growth of tungsten grains.

In the second heat treatment process, other gases which doesn't react with tungsten may be used instead of nitrogen or argon gas.

Meanwhile, in case of forming a device which does not need low resistance below 2.0 Ω/sq, resistance characteristic required by the device can be satisfied by performing only the first heat treatment.

Figure 3E:
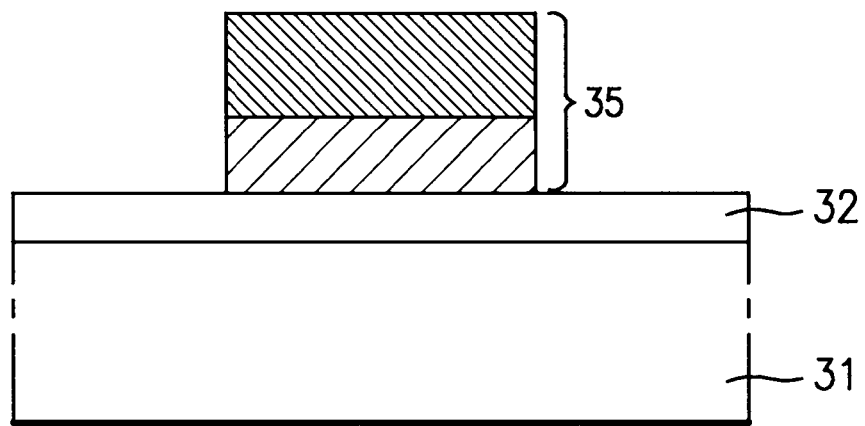

Referring to FIG. 3e, the tungsten film 34b of a reduced nitrogen content and the semiconductor layer 33 are selectively etched using photolithography, to form a conductive line 35.

Figure 3F:
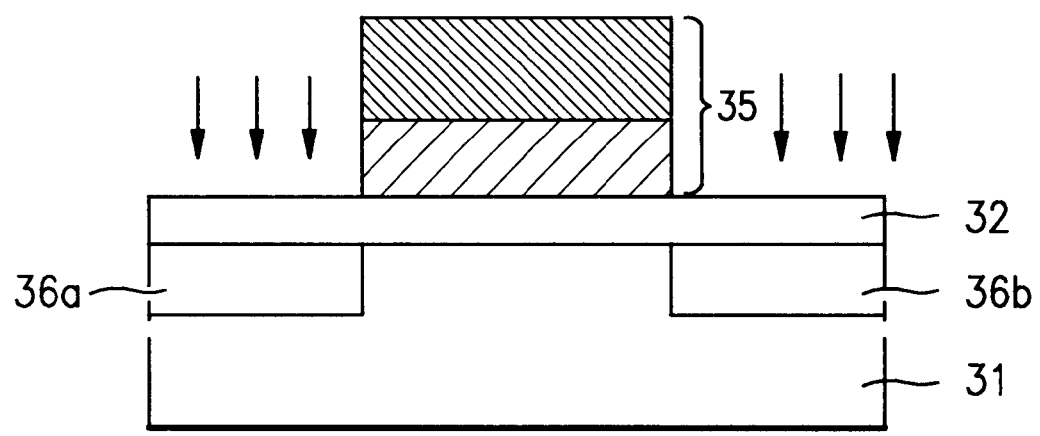

Thereafter, impurity ions are implanted on an entire surface of the substrate using the conductive line 35 as a mask, and the implanted ions are drive-in diffused to form source/drain regions 36a and 36b within the semiconductor substrate 31 at both sides of the conductive line 35, as shown in FIG. 3f.

In the above-described process of forming a conductive line according to the present invention, the first and the second heat treatments may be performed after forming the conductive line 35, or after implanting the impurity ions for forming source and drain regions 36a and 36b.

Characteristics of the conductive line of a semiconductor device formed with the aforementioned process steps will be described hereafter.

Figure 4:
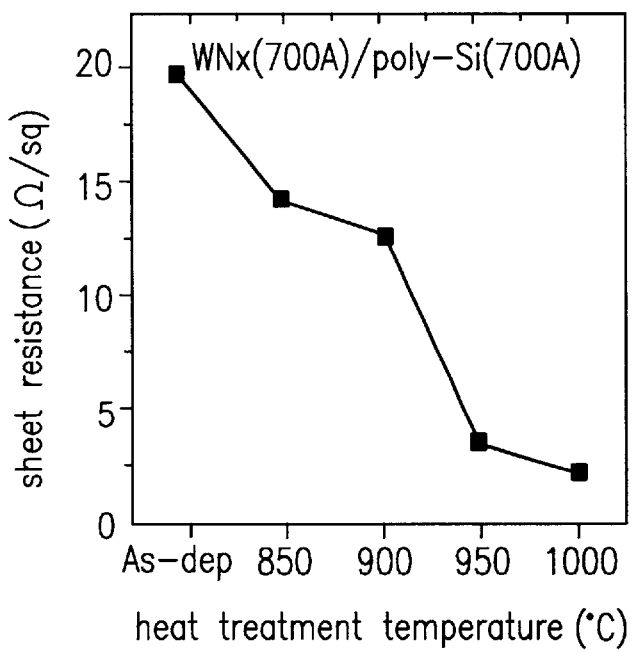
FIG. 4 is a graph showing variation in sheet resistance in accordance with the temperature of heat treatment.
Figure 5:
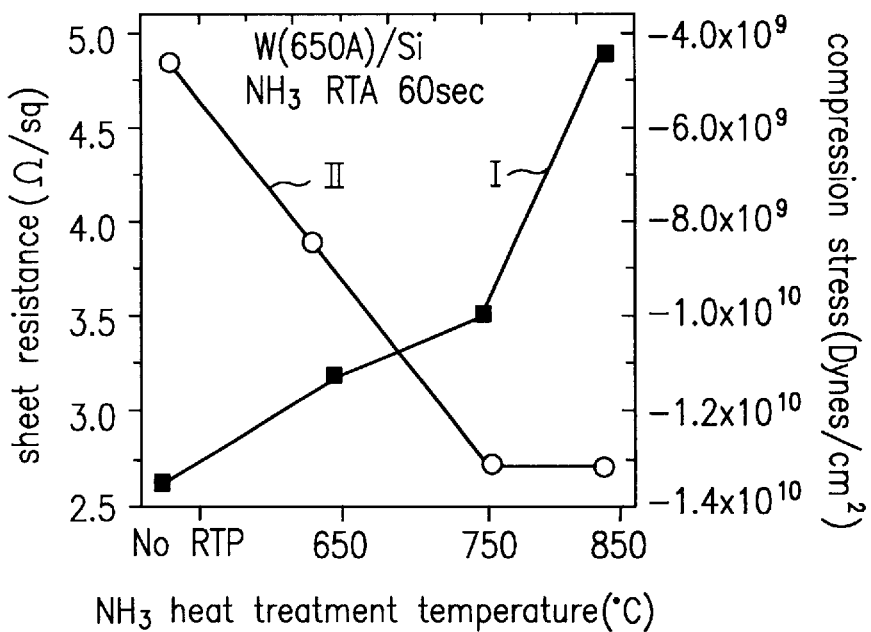
FIG. 5 is a graph showing variation in resistance and compression stress during $NH_3$ heat treatment according to the present invention.
Figure 6:
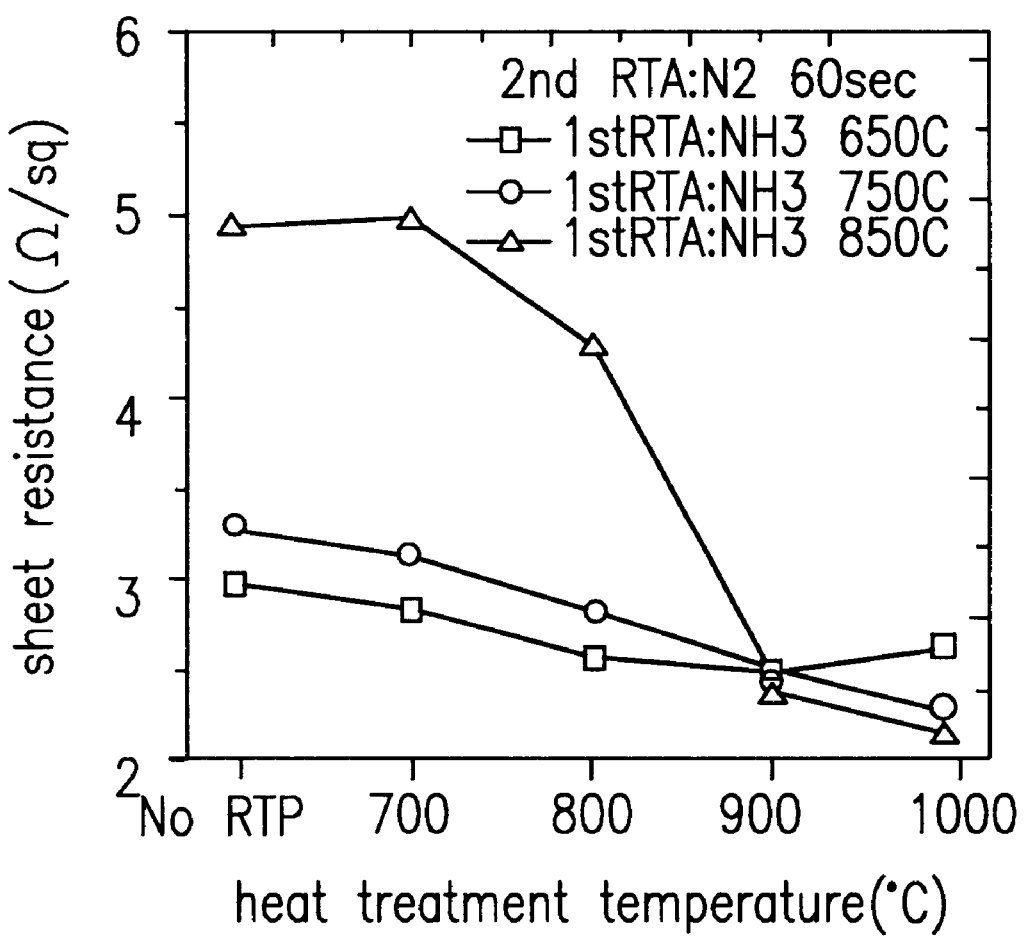
FIG. 6 is a graph showing variation in sheet resistance in accordance with a first and a second heat treatments.

FIG. 4 is a graph showing variation in sheet resistance in accordance with the temperature of the heat treatment, FIG. 5 is a graph showing is a graph showing variation in resistance and compression stress during $NH_3$ heat-treatment according to the present invention, and FIG. 6 is a graph showing variation in sheet resistance in accordance with the first and the second heat treatments.

The process of forming a conductive line according to the present invention deposits a pure tungsten film 34 on the semiconductor layer 33 and carries out the first heat treatment in an ambient of $NH_3$, to simplify process steps and ensure sufficient resistance characteristic.

A nitrified tungsten film 34a formed with the first heat treatment has a resistance value corresponding to 70–90% of the sheet resistance of the tungsten nitride used in the conventional denudation tungsten/silicon conductive line. Here, the tungsten nitride used in the conventional conductive line is formed in a manner that tungsten is nitrified when deposited, whereas the nitrified tungsten film 34a of the present invention is formed in a manner that pure tungsten is deposited and then changed into nitrified tungsten during the subsequent heat treatment.

FIG. 4 shows variation of sheet resistance in accordance with the temperature of the heat treatment, when polysilicon and tungsten nitride are deposited with a thickness of 700 Å, respectively in the denudation tungsten/silicon conductive line structure. At this time, a heat treatment at a temperature above 950° C. is required to satisfy the sheet resistance characteristic of the device. This is, the sheet resistance characteristic may be satisfied, but thermal stress is still applied to the substrate.

In contrast to this, the method for forming a conductive line according to the present invention can sufficiently ensure low resistance characteristic even at a low temperature of 650–750° C., as shown in FIG. 5. FIG. 5 shows variation in resistance and compression stress during $NH_3$ heat-treatment according to the present invention, when the tungsten layer is formed with a thickness of 650 Å and the first heat treatment is executed for 60 seconds.

In FIG. 5, I denotes the variation in sheet resistance and II denotes compression stress. Increase in sheet resistance and strengthening of compression stress indicate that the tungsten film 34 is being nitrified. The nitrified tungsten film 34a formed with this nitrifying process can sufficiently reduce reaction with the silicon layer placed therebelow.

FIG. 6 shows variation in sheet resistance with a first and a second heat treatments, when the first heat treatment is performed at 650° C. (-□-), 750° C. (-○-) and 850° C. (-△-), respectively in an ambient of $NH_3$, and then the second heat treatment is carried out in an ambient of $N_2$. In case of the heat treatment at the temperature of 750° C., the sheet resistance becomes 3.5 Ω/sq after execution of the first heat treatment. The sheet resistance then linearly decreases as the temperature increases during the second heat treatment, reaching to 2.3 Ω/sq at 1000° C.

This means that the nitrified tungsten film 34a after the first heat treatment doesn't react with silicon during the subsequent heat treatment at a high temperature. With the second heat treatment, nitrogen contained in the nitrified tungsten film 34a is out-diffused to reduce the nitrogen content, and simultaneously, grow tungsten grains. Accordingly, the tungsten film 34b of a reduced nitrogen content may obtain an electric resistance lower than that of the tungsten/silicon layer before execution of the first heat treatment.

As described above, the method for forming a conductive line of a semiconductor device according to the present invention has the following advantages.

Firstly, the reaction prevention film required for restraining reaction between the semiconductor layer and tungsten layer is not formed, thereby simplifying process steps and reducing production cost.

Secondly, the conductive line with a low resistance can be obtained, thereby improving operation characteristics of a device.

Thirdly, since thermal stress applied to lower layers (including the substrate) can be reduced by performing the heat treatment for ensuring low resistance characteristic, reliability of a device can be enhanced. This also prevents a variation in impurity distribution of the semiconductor substrate.

It will be apparent to those skilled in the art that various modifications and variations can be made in the method for forming a conductive line of a semiconductor device of the present invention without departing from the spirit or scope of the invention. Thus, it is intended that the present invention cover the modifications and variations of this invention provided they come within the scope of the appended claims and their equivalents.

What is claimed is:

1. A method for forming a conductive line of a semiconductor device comprising:

forming an insulating layer on the semiconductor substrate;

sequentially forming a semiconductor layer and a tungsten film on the insulating layer;

nitrifying the tungsten film with heat treatment; and selectively etching the nitrified tungsten film and the semiconductor layer, wherein the semiconductor layer is formed with silicon, germanium, or a compound of silicon and germanium ($Si_xGe_{1-x}$).

2. The method for forming a conductive line of a semiconductor device as claimed in claim 1, wherein the heat treatment for nitrifying the tungsten film is performed at 500–1000° C. in an ambient of $NH_3$.

3. The method for forming a conductive line of a semiconductor device as claimed in claim 1, wherein the heat treatment is performed after forming a molybdenum film on the semiconductor layer.

4. The method for forming a conductive line of a semiconductor device as claimed in claim 1, wherein the heat treatment for nitrifying the tungsten film nitrifies substantially the entire thickness of the tungsten film.

5. The method for forming a conductive line of a semiconductor device as claimed in claim 1, further comprising:

a second heat treatment in a non-reactive ambient.

6. The method for forming a conductive line of a semiconductor device as claimed in claim 1, wherein the tungsten film is formed to a thickness of 600–800 Å.

7. A method for forming a conductive line of a semiconductor device, comprising:

forming an insulating layer on a semiconductor substrate;

sequentially forming a semiconductor layer and a tungsten film on the insulating layer;

nitrifying the tungsten film with a first heat treatment;

outwardly diffusing nitrogen contained in the nitrified tungsten film with a second heat treatment to grow tungsten grains at an interface of the tungsten film and the semiconductor layer; and selectively etching the tungsten film and semiconductor layer.

8. The method for forming a conductive line of a semiconductor device as claimed in claim 7, wherein the semiconductor layer is formed with silicon, germanium or compound of silicon and germanium ($Si_xGe_{1-x}$).

9. The method for forming a conductive line of a semiconductor device as claimed in claim 7, wherein the first heat treatment is performed at 500–1000° C. in an ambient of $NH_3$.

10. The method for forming a conductive line of a semiconductor device as claimed in claim 7, wherein the first heat treatment is performed after forming a molybdenum film on the semiconductor layer.

11. The method for forming a conductive line of a semiconductor device as claimed in claim 7, wherein the second heat treatment is performed at 600–1410° C. in an ambient of $N_2$ or Ar.

12. The method for forming a conductive line of a semiconductor device as claimed in claim 7, wherein the first and second heat treatments are performed after selectively etching the tungsten layer and semiconductor layer.

13. A method for forming a conductive line of a semiconductor device, comprising:

sequentially forming a gate insulating film and a semiconductor layer on a semiconductor substrate;

forming a tungsten film on the semiconductor layer;

nitrifying the tungsten film with a first heat treatment in an ambient of $NH_3$, to form a nitrified tungsten film;

outwardly diffusing nitrogen contained in the nitrified tungsten film with a second heat treatment and growing tungsten grains at an interface of the tungsten film and semiconductor layer, to form a tungsten film of a reduced nitrogen content;

selectively etching the tungsten film of a reduced nitrogen content and the semiconductor layer using photolithography, to form a conductive line; and implanting impurity ions into an entire surface of the semiconductor substrate using the conductive line as a mask and drive-in diffusing the implanted impurity ions, to form source and drain regions within the semiconductor substrate at both sides of the conductive line.

14. The method for forming a conductive line of a semiconductor device as claimed in claim 13, wherein the first and second heat treatments are performed after selectively etching the tungsten film and the semiconductor layer.

15. The method for forming a conductive line of a semiconductor device as claimed in claim 13, wherein the first and second heat treatments are performed after implanting the impurity ions for forming the source and drain regions.

16. The method for forming a conductive line of a semiconductor device as claimed in claim 13, wherein the conductive line is formed by selectively etching the nitrified tungsten film and the semiconductor layer without the second heat treatment after nitrifying the tungsten film with the first heat treatment.

17. The method for forming a conductive line of a semiconductor device as claimed in claim 13, wherein the semiconductor layer is formed with silicon, germanium or compound of silicon and germanium ($Si_xGe_{1-x}$).

18. The method for forming a conductive line of a semiconductor device as claimed in claim 13, wherein the first heat treatment for nitrifying the tungsten film is performed at 500–1000° C. in an ambient of $NH_3$.

19. The method for forming a conductive line of a semiconductor device as claimed in claim 13, wherein the first heat treatment is performed after forming a molybdenum film on the semiconductor substrate.

20. The method for forming a conductive line of a semiconductor device as claimed in claim 13, wherein the second heat treatment for nitrifying the tungsten layer is performed at 600–1410° C. in an ambient of $N_2$ or Ar.

21. The method for forming a conductive line of a semiconductor device as claimed in claim 13, wherein the semiconductor layer is formed with a thickness of 600–800 Å.

22. The method for forming a conductive line of a semiconductor device as claimed in claim 13, wherein the tungsten film is formed with a thickness of 600–800 Å.

* * * * *